United States Patent [19]

Sumi et al.

[11] Patent Number: 5,686,355

[45] Date of Patent: Nov. 11, 1997

[54] METHOD FOR FORMING FILM OF REFRACTORY METAL

[75] Inventors: Hirofumi Sumi; Chigusa Yamane, both of Kanagawa, Japan

[73] Assignee: Sony Corporation, Japan

[21] Appl. No.: 546,715

[22] Filed: Oct. 23, 1995

[30] Foreign Application Priority Data

Oct. 27, 1994 [JP] Japan .................... 6-263805

[51] Int. Cl.[6] .................... H01L 21/44
[52] U.S. Cl. .................... 437/192; 437/200
[58] Field of Search .................... 437/192, 189, 437/200

[56] References Cited

U.S. PATENT DOCUMENTS

| | | | |
|---|---|---|---|
| 5,028,565 | 7/1991 | Chang et al. | 437/192 |
| 5,429,991 | 7/1995 | Iwasaki et al. | 437/192 |
| 5,517,037 | 5/1996 | Yamamoto | 437/193 |
| 5,529,953 | 6/1996 | Shoda | 437/192 |

FOREIGN PATENT DOCUMENTS

| | | | |
|---|---|---|---|
| 0140133 | 6/1986 | Japan | 437/192 |
| 0251053 | 11/1986 | Japan | 437/192 |
| 6275624 | 9/1994 | Japan | 437/192 |

OTHER PUBLICATIONS

C.M. Melliar-Smith, et al., "Chemically Vapor Deposited Tungsten for Semiconductor Metallizations", J. of Electrochemical Soc., vol. 121, No. 2, pp. 298–303.

K. R. Laud, et al., "Blanket CVD-W Formed by $SiH_4$ Reduction on $WF_6$ on TiN for Planar Interconnection", Extended Abstracts of the 21st Conference on Solid State Devices and Materials;, Tokyo 1989, pp. 41–44.

Primary Examiner—Charles L. Bowers, Jr.
Assistant Examiner—Ramamohan Rao
Attorney, Agent, or Firm—Ronald P. Kananen

[57] ABSTRACT

A method for forming a film of refractory metal used for interconnection in a semiconductor integrated circuit and, above all, to a method for forming a tungsten film (Blk-W film) by a blanket CVD method. A blanket tungsten (Blk-W) film 10 is formed with good adherence and coverage on an $SiO_x$ based interlayer insulating film 3 having a minute-sized contact hole 4 for improving reliability in an interconnection. Before proceeding to Blk-W-CVD, a substrate having a Ti-based adherent layer 7 on its uppermost surface is heated and exposed to a silane-based gas atmosphere for forming Si-nuclei on its surface. A W-nucleus 9 is formed by reducing the $WF_6$ gas with $H_2$ and a Blk-W film 10 is also formed by reducing the $WF_6$ with $SiH_4$ under a rate determined by the rate of the surface reaction. If the substrate is preliminarily heated before forming the Si nuclei, formation of the Si nuclei proceeds with improved uniformity. The W-nuclei may be carried out uniformly in a temperature range of 450° C. or higher. If the substrate heating temperature during high speed growth is lowered to a temperature lower than that during W-nucleus formation, the thermal stress in the substrate may be released for further improving adherence between the Blk-W film 10 and the substrate.

10 Claims, 2 Drawing Sheets

METHOD FOR FORMING FILM OF REFRACTORY METAL

BACKGROUND OF THE INVENTION

This Invention relates to a method for forming a film of refractory metal used for interconnection in a semiconductor integrated circuit and, above all, to a method for forming a tungsten film (Blk-W film) by a blanket CVD method. More particularly, it relates to a method for burying a Blk-W film in a minute-sized connection hole with high adhesion and coverage.

The opening diameter of the connection hole in a semiconductor integrated circuit is considered to be subjected to a design rule on the order of 0.35 μm and 0.25 μm, with the 64M DRAM of the next generation and with the 256M DRAM of the next-to-next generation, respectively. However, the aspect ratio of the connection hole tends to be increased abruptly due to the difficulties met in reduction of the vertical dimension, that is the dimension along the film thickness, of a variety of material layers, as compared to reduction of the horizontal dimension thereof, and also due to the use of a multi-layered interconnection structure. Heretofore, filling in the connection hole is accomplished by forming a film of metal, typified by Al or an Al alloy, by sputtering. However, if the aspect ratio of the connecting hole exceeds 2, sufficient step coverage cannot be assured by the sputtering method, this leads to connection troubles between the upper and lower interconnections.

For overcoming shortage in step coverage, there is proposed a method of burying a refractory metal film in the inside of the connection hole for forming a metal plug. With the proposed method, a refractory metal film is formed by CVD on the entire surface of an interlayer insulating film on which the connection hole is opened. The refractory metal film is then etched back except in the inside of the via-hole. An illustrative example of the refractory metal film is a W film. The method of forming the W film on the entire surface of a substrate is termed a blanket tungsten CVD method (Blk-W-CVD method) and the W film so formed is termed a blanket tungsten film (Blk-W film).

The Blk-W film, superior in step coverage, fails to exhibit sufficient adhesion to an $SiO_x$ interlayer insulating film when deposited thereon because of an excessive internal stress difference on an interface region. This problem is discussed in, for example, Journal of Electrochemical Society, vol. 121, No. 1, pages 298 to 303. When forming the Blk-W film, it is necessary not only to prevent a substrate from being eroded by $WF_6$, a starting gas material, but also to increase barrier property with respect to the lower interconnection layer in view of heating incurred in the substrate during film formation.

For overcoming these problems, an adherent layer, also performing the role of barrier metal, is provided as an underlying film with respect to the Blk-W film. The materials having superior barrier property may be enumerated by a titanium oxide (TIN) film and a titanium oxynitride (TiON) film formed by the sputtering method. However, these films are actually layered in many cases with a Ti film having excellent ohmic property for reducing the native oxide film, formed on the Si substrate exposed on the bottom surface of the connection hole, with Ti. This Ti film is also usually formed by sputtering.

On the other hand, the W film is usually formed by CVD taking advantage of the reducing reaction of tungsten hexafluoride ($WF_6$) gas with silane ($SiH_4$) or with hydrogen ($H_2$). However, if the upper most surface of the adherent layer is a TiN film, it is difficult to form the W film by the reducing CVD, due to low adherent dissociation probability of $H_2$ on the TiN film, as discussed in Extended Abstracts of the 21st Conference on Solid State Devices and Materials, Tokyo, 1989), pages 41 to 44. For this reason, a two-stage film-forming method is usually employed, in which a W nucleus is rapidly formed by carrying out the reducing CVD with $SiH_4$ and subsequently carrying out the reducing CVD with $H_2$ for achieving rapid growth of the Blk-W film having an excellent step coverage. During the nucleus-forming stage and rapid growth stage, the reaction condition used is such that mainly the surface reaction rate governs the overall reaction rate.

A frequent practice is to use an intermediate stage of film formation between the nucleus forming stage and the high-speed growth stage. During this intermediate stage, the flow ratio of $H_2$ to $WF_6$ is selected to be higher than that during the subsequent rapid growth stage, thereby contributing to reduction in the total film-forming time. For this intermediate stage, the $WF_6$ supply rate mainly governs the reaction rate.

The thicker the Ti film constituting a portion of the adherent layer, the more effectively the native oxide film on the Si substrate is reduced. However, with the sputtering method, since the opening end of the connection hole is generally in an overhanging shape, the effective opening diameter of the connection hole is reduced with increase in the film thickness, such that it becomes difficult to bury the Blk-W film in a subsequent process. The same occurs when it is attempted to increase the film thickness of the TiN or TiON film layered on the Ti film for prohibiting the Ti film from being eroded by the $WF_6$ gas. This problem is shown in FIG. 1 illustrating the state in which an $SiO_x$ based interlayer insulating film 23 is layered on a Si substrate 21, on which an impurity-diffused region 22 is previously formed as a lower interconnection layer, and in which a Ti-based adherent layer 27 made up of a Ti film 25 and a TiN film 26 is formed to an increased thickness for covering a connection hole 24 opened on the $SiO_x$-based insulating film 23 for facing the impurity-diffused region 22. The connection hole 24 has an effective opening diameter d which becomes very small because of the overhang shape of the Ti-based adherent layer Thus the Ti-based adherent layer 27 cannot be increased excessively. However, an optimum film thickness of the Ti film, TiN film or the TiON film has not been established as yet.

As for the TiN film, it has been proposed to form the film by thermal CVD employing $TiCl_4$ or an organic titanium compounds. However, the TiN film formed by the thermal CVD method exhibits a specific resistance higher than with the film formed by sputtering such that there is no good prospect in mass-producing the TiN film.

On the other hand, the Blk-W film becomes inferior in coverage at the stage in which the supply quantity determines the overall reaction rate. This problem is raised when the above-described intermediate stage is used for shortening the total film-forming time. That is, if the Ti-based adherent layer 27 is formed to a smaller film thickness, but the Blk-W film 28 has poor coverage, the overhang portion of the Blk-W film 28 becomes cured to stop the connection hole 24 before burial in the connection hole 24, such that a void 29 is left in the connection hole 24, as shown in FIG. 2. This problem tends to be similarly raised when forming a refractory metal film other than a W film.

OBJECT AND SUMMARY OF THE INVENTION

It is therefore an object of the present invention to provide a film forming method enabling stable burial of a refractory metal film in a minute-sized connection hole while prohibiting peeling of the refractory metal film on the SiO$_x$ film.

According to the present invention, there is provided a method for forming a refractory metal film having a pre-processing step of exposing a substrate to an atmosphere containing a silane-based gas while heating the substrate and a film-forming step of forming a refractory metal film on the substrate by CVD.

Heating during the pre-processing step is carried out at a temperature capable of thermally decomposing the silane-based gas and forming Si nuclei on the substrate surface.

The silane-based gases may be exemplified by known compounds, such as SiH$_4$ (silane) or Si$_2$H$_6$ (disilane).

The atmosphere for the pre-processing step may be admixed with inert gases. Examples of the inert gases that may be employed include rare gases, such as He or Ar, N$_2$ or mixtures thereof.

Before the pre-processing step, the substrate is preferably heated for a pre-set time. The heating temperature at this time may be suitably set so as to be capable of raising the vapor pressure to a value sufficient for desorbing volatile components, such as water adsorbed on the substrate. For promptly transferring to the next pre-processing step, it is particularly desirable to set the temperature to a value equal or proximate to the substrate temperature during the pre-processing step.

During the film forming step, formation of nuclei of refractory metal and rapid growth of the refractory metal film are carried out sequentially at a rate determined by the rate of the surface reaction. After the nuclei have been formed on the substrate, rapid growth of the refractory metal film may be carried out at a substrate heating temperature lower than that during formation of nuclei for relieving thermal stress induced in the substrate.

Taking an example of forming a Blk-W film, formation of nuclei at a rate determined by the surface reaction rate may be achieved by reduction of WF$_6$ by silane under a lower pressure, while rapid growth at a rate determined by the surface reaction rate may be achieved by reduction of WF$_6$ by H$_2$, similarly under a lower pressure. The nuclei of the refractory metal film are preferably formed in a temperature range of not lower than 450° C. If only the nuclei are to be formed by thermal decomposition of WF$_6$, the substrate heating temperature on the order of 200° C. suffices. However, for prohibiting unneeded volatile components from being re-deposited on the substrate by raising the vapor pressure of these volatile components for uniformly forming nuclei on a clean substrate surface at a practical speed, heating to 450° C. or higher is required.

According to the present invention, a substrate having a titanium based adherent layer may be employed as the substrate. The materials of the titanium-based adherent layer may be exemplified by Ti, TiN, TiON or TiW which may be used as a single layer or multi-layer construction.

With the film forming method of the present invention, Si nuclei may be formed on the substrate surface in the pre-processing step prior to formation of the refractory metal film by thermal decomposition of the silane-based gas. If the Si-nuclei are formed along with the silane-based gas in an atmosphere containing inert gases, the Si nuclei may be improved in uniformity by dilution effects. The Si nuclei may be further uniformed by effecting preliminary heating of the substrate before the pre-processing step. If the starting gas material of the refractory metal is supplied to the substrate on which Si nuclei have been formed, the starting gas material is reduced rapidly by Si nuclei thus allowing the nuclei of the refractory metal to be formed uniformly. For example, if the Blk-W film is formed as a refractory metal film by CVD employing the WF$_6$ gas, W nuclei are formed rapidly at the substrate heating temperature of 450° C. by the reaction represented by the following formula:

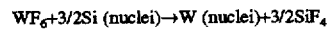

After the W nuclei have been formed on the substrate, uniform rapid growth proceeds beginning from the nuclei. According to the present invention, since the formation of nuclei and the rapid growth proceed at a rate determined by the surface reaction rate, coverage may be improved, while no voids are produced in the minute-sized connection holes. If the substrate heating temperature is lower than that during formation of nuclei, the thermal stress induced in the substrate may be relieved for improving adherence between the refractory metal film and the substrate.

If a substrate having a Ti-based adherent layer is employed as the substrate, Si nuclei are first formed thereon, so that, if the substrate is exposed to the WF$_6$ gas, it is quickly reduced for prohibiting corrosion of the Ti-based adherent layer.

According to the present invention, the refractory metal film typified by the W film may be formed with good coverage, without the necessity of forming the underlying adherent layer to an excessive thickness, while the refractory metal film may be prohibited from being peeled off. Thus the refractory metal film may be buried in the inside of the connection hole having a minute-sized opening and a larger aspect ratio.

DETAILED DESCRIPTION OF THE PREFERRED EMBODIMENTS

The present invention will be explained with reference to illustrative Examples of the invention.

EXAMPLE 1

Figure 1:
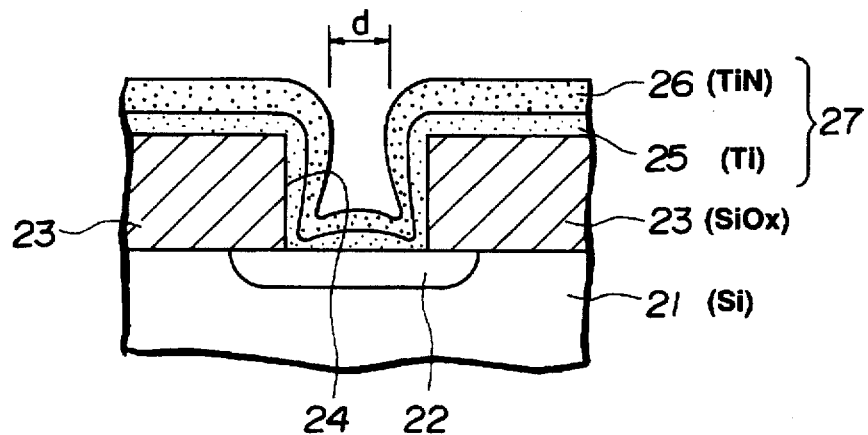
FIG. 1 is a schematic cross-sectional view showing the state in which, in a conventional process, a Ti-based adherent layer is deposited to an excessive thickness thus reducing the effective opening diameter of a contact hole.
Figure 2:
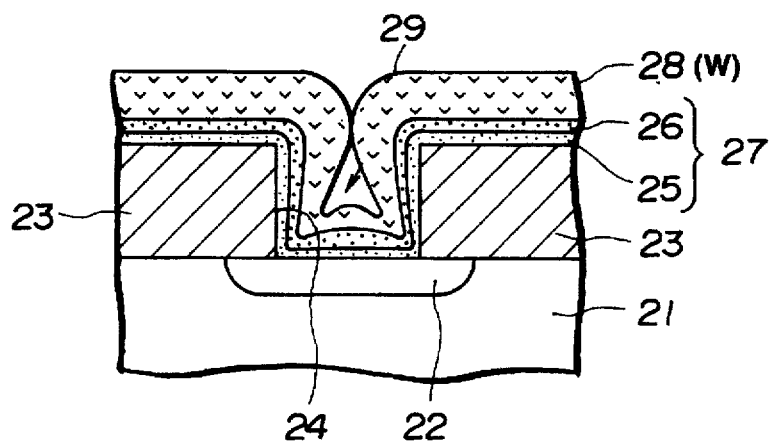
FIG. 2 is a schematic cross-sectional view showing the state in which, in a conventional process, the Blk-W film is deteriorated in coverage due to rapid growth under conditions in which the supply quantity decides the reaction rate, thus producing a void in a contact hole.
Figure 3:
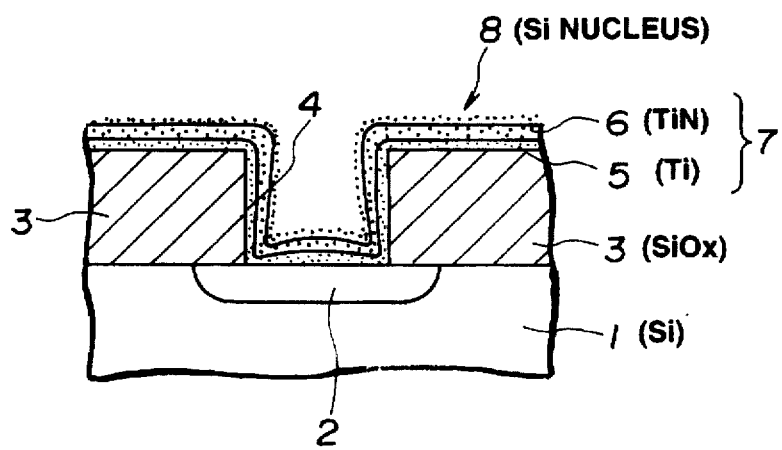
FIG. 3 is a schematic cross-sectional view showing the state in which, in a typical process employing the film-forming method for forming a refractory metal film according to the present invention, a Si nucleus has been formed on a Ti-based adherent layer covering a contact hole.
Figure 4:
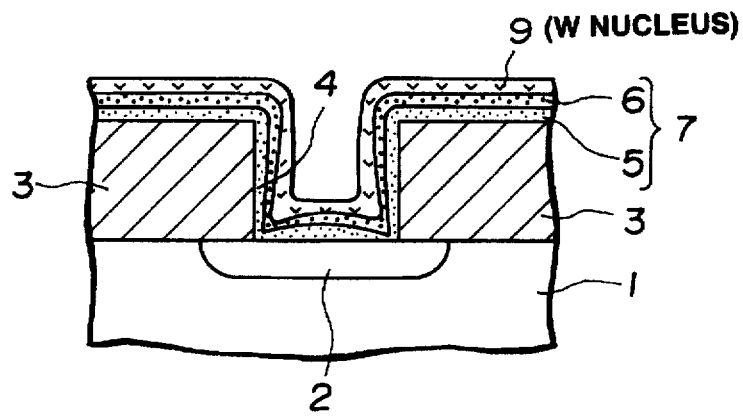
FIG. 4 is a schematic cross-sectional view showing the state in which the Si nucleus in FIG. 1 has been reduced and the surface of the Ti-based adherent layer has been covered by a W-nucleus.
Figure 5:
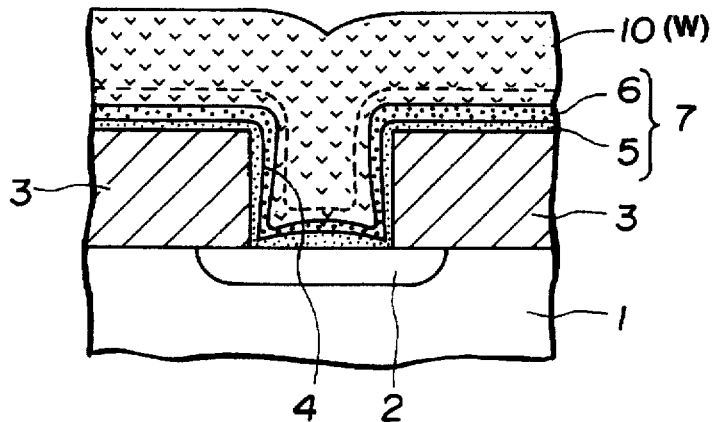
FIG. 5 is a schematic cross-sectional view showing the state in which a Blk-W film has been grown rapidly beginning from the W-nucleus of FIG. 2 thus achieving uniform burial in a contact hole.
Figure 6:
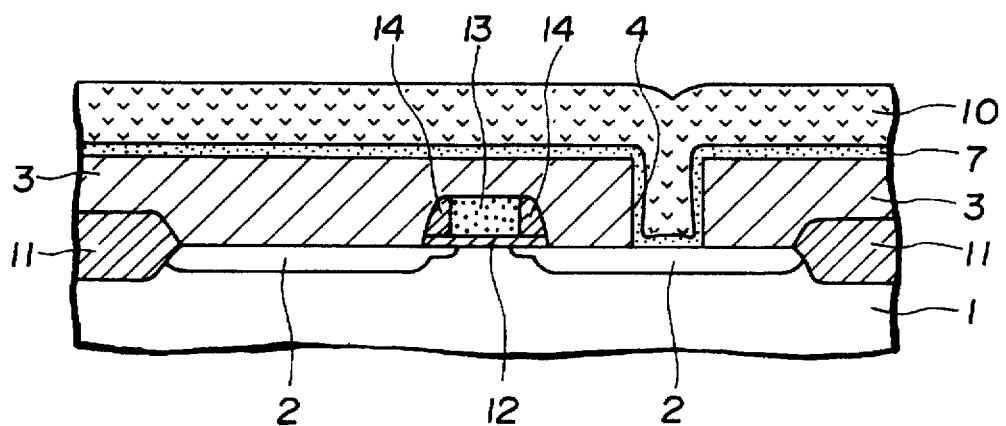
FIG. 6 is a schematic cross-sectional view showing another cross-section of a MOS-FET prepared by application of the process shown in FIGS. 1 to 3.

In the present Example, a Blk-W film was formed on a substrate on which a Ti-based adherent layer having a Ti/TiN two-layer structure had been formed and which was preliminarily heated and pre-processed with an SiH$_4$ gas. This process is explained by referring to FIGS. 3 to 5. FIG. 6 shows a cross-section of a MOS field effect transistor (MOS-FET) to which the present process is actually applied for fabrication thereof, and FIGS. 3 to 5 show cross-sections of the vicinity of the contact hole of the same MOS-FET.

First, an SiO$_X$ based interlayer insulating film 3 was layered on an Si(100) substrate 1, on which an impurity-diffused layer 2 had been pre-formed as a lower interconnection layer. This SiO$_X$ based interlayer insulating film 3 was patterned to form a contact hole 4 having a diameter of 0.35 μm, as shown in FIG. 3.

The impurity-diffused region 2 corresponds to a source-drain region of the MOS-FET of FIG. 6. If the conductivity type is n$^+$, As$^+$, as an example, is introduced under an ion accelerating energy of 20 keV and a dosage of 5×10$^{15}$/cm$^2$, whereas, if the conductivity type is p$^+$, BF$_2$$^+$, as an example is introduced under an ion accelerating energy of 20 keV and a dosage of 3×10$^{15}$/cm$^2$. The SiO$_X$ based interlayer insulating film 3 is constituted by layering the SiO$_X$ film and a borophosphate silicate glass (BPSG) film by sequentially carrying out LPCVD using tetraethoxy silane (TEOS) and ambient pressure CVD using SiH$_4$/PH$_3$/B$_2$H$_6$/O$_2$/N$_2$ mixed gas. The contact hole 4 was opened by dry etching using a resist mask, not shown, with the aid of a magnetron RIE device and a c-C$_4$F$_8$ (cyclooctafluorobutane) gas. Into the impurity-diffused region 2, exposed by formation of the contact hole 4, contact-forming ions were introduced by ion implantation. Into the n$^+$ impurity-diffused region 2 and into the n$^+$ impurity-diffused region 2, As$^+$ and BF$_2$ ions were respectively introduced by ion implantation under the same conditions as described above. The introduced impurities were activated by rapid thermal annealing (RTA) at 1050° C. for five seconds.

The wafer in the above-described state was processed with usual sputtering and reactive sputtering for sequentially forming a Ti film 5 and a TiN film 6 to film thicknesses of approximately 30 nm and 70 nm, respectively, for forming a Ti-based adherent layer 7. For forming the Ti film 5, a collimator for sorting fine sputtering particles with an arrival angle within a pre-set range was mounted between a Ti target and a wafer. The Ti film 5 was formed under illustrative conditions of an Af flow rate of 100 SCCM, a gas pressure of 0.47 Pa, an RF power of 4 kW (13.56 MHz), and a substrate heating temperature of 450° C., while the TiN film 6 was formed under illustrative conditions of an Ar flow rate of 40 SCCM, an N$_2$ flow rate of 70 SCCM, a gas pressure of 0.47 Pa, an RF power of 5 kW and a substrate heating temperature of 450° C.

With the above-mentioned sputtering process, the Ti-based adherent layer 7 could be formed to excellent coverage while the overhang was suppressed to a minimum amount. The Ti-based adherent layer 7 has a thickness of 100 nm, which was a value of not drastically reducing the opening diameter of the contact hole 4.

The wafer was then set on a LPCVD device for forming a Blk-W film and preliminarily heated at 450° C. for 30 seconds without flowing gases. By this preliminary heating, water and other volatile components, affixed to the wafer surface, were removed.

By way of pre-processing, Si nuclei were formed under illustrative conditions of an SiH$_4$ flow rate of 30 SCCM, an Ar flow rate of 1600 SCCM, an N$_2$ flow rate of 300 SCCM, a gas pressure of 107 Pa and a substrate heating temperature of 450° C.

By this pre-processing, Si nuclei 8 were uniformly generated on the surface of the TiN film 6, as shown in FIG. 3.

Then, W nuclei were formed by reducing WF$_6$ with SiH$_4$ under illustrative nucleus-forming conditions of a WF$_6$ flow rate of 5 SCCM, an SiH$_4$ flow rate of 3 SCCM, an Ar flow rate of 1600 SCCM, an N$_2$ flow rate of 300 SCCM, a gas pressure of 107 Pa and a substrate heating temperature of 450° C.

During this process, a reaction of rapid reduction of the WF$_6$ gas with the Si nuclei proceeded at a rate determined by surface reaction. As a result, the wafer surface was uniformly covered with W nuclei 9 as shown in FIG. 4.

A W film was then rapidly grown by reducing WF$_6$ with H$_2$ under illustrative nucleus-forming conditions of a WF$_6$ flow rate of 60 SCCM, an H$_2$ flow rate of 400 SCCM, an Ar flow rate of 2000 SCCM, an N$_2$ flow rate of 250 SCCM, a gas pressure of 107 Pa and a substrate heating temperature of 450° C.

During this process, since Si was grown at a high rate governed by surface reaction, a Blk-W film 10 could be buried in the inside of the contact hole 4 without producing voids. An observation with a scanning electron microscope revealed that corrosion of the Ti-based adherent layer 7 was not caused and hence the Blk-W film 10 was uniformly formed without undergoing peeling.

FIG. 6 shows, in a schematic cross-sectional view, a MOS-FET constructed by actual application of the above process. That is, the impurity-diffused region 2 is formed on the Si(100) substrate 1 in self-alignment with respect to a sidewall 14 and a gate electrode 13 formed via a gate oxide film 12 in a device-forming region delimited by the gate oxide film 11, and constitutes a source-drain region having an LDD structure. The contact hole 4 is opened on the impurity-diffused region 2 of the SiO$_X$ based interlayer insulating film 3 covering the entire substrate surface. It is noted that the contact hole is opened on one of the impurity-diffused regions 2 insofar as the cross-sectional plane shown in FIG. 6 is concerned.

The Ti-based adherent layer 7 and the Blk-W film 10 are formed so as to be uniformly buried in the contact hole 4. The Blk-W film 10 and the Ti-based adherent layer 7 may be patterned during the subsequent process so as to be directly used as an upper layer interconnection pattern. However, the Ti-based adherent layer 7 and the Blk-W film 10 may also be etched back using an etching gas such as SF$_6$ so that the Ti-based adherent layer 7 and the Blk-W film 10 will be left only in the inside of the contact hole for use as a metal plug. In this case, the upper layer interconnection pattern needs to be formed of another electrically conductive material. To this end, a Ti/Al—Cu layered interconnection film, for example, may be employed.

EXAMPLE 2

In the present Example, the substrate is heated during rapid growth of the Blk-W film to a temperature lower than that during nucleus formation.

That is, the Blk-W film 10 was grown rapidly under the same conditions as in Example 1 except that the preliminary heating, pre-processing (Si-nucleus formation) and the W-nucleus formation were carried out at a substrate heating temperature of 450° C. as in Example 1, after which the substrate heating temperature was lowered to 400° C. Although the temperature was lowered in this manner, the reaction rate is determined by that of the surface reaction, as before.

In the present Example, the Blk-W film 10 had improved adhesion characteristics which resulted due to relieved thermal stress in the SiO$_X$ based interlayer insulating film 3.

Although the present invention has been described with reference to the two examples, the present invention is not limited to these merely illustrative examples.

For example, the TiN film used in the above-described embodiments for constituting an upper layer side of the Ti-based adherent layer 7 may be replaced by a TiON film. Although the substrate heating temperature is lowered in Example 2 during the stage of rapid growth of the Blk-W film, the substrate heating temperature employed in the preliminary heating step or the pre-processing step (Si-nucleus forming step) may similarly be lowered. The device fabricated by the present invention is not limited to a MOS-FET and may also be a bipolar transistor or a charge-coupled device (CCD).

In addition, the construction of the interlayer insulating film, thickness of various layers, design rules, ion implantation conditions, sputtering conditions or the CVD conditions may be suitably modified.

What is claimed is:

1. A method for forming a refractory metal film comprising:
   a pre-processing step of exposing a substrate to an atmosphere containing a silane-based gas while heating said substrate resulting in Si nuclei formation on the surface of said substrate; and
   a film-forming step of forming a refractory metal film on said substrate by CVD.

2. The method as claimed in claim 1 wherein an inert gas is added to said atmosphere during said pre-processing step.

3. The method as claimed in claim 1 further comprising a preliminary heating step of heating said substrate for a pre-set time before said pre-processing step.

4. The method as claimed in claim 1 wherein formation of nuclei of the refractory metal and rapid growth of the refractory metal film are sequentially carried out during the film-forming step and wherein the formation of nuclei of the refractory metal and rapid growth of the refractory metal film are allowed to proceed at a rate mainly determined by surface reaction rate.

5. The method as claimed in claim 4 wherein rapid growth of the refractory metal film is carried out at a substrate heating temperature lower than that during nucleus formation.

6. The method as claimed in claim 1 wherein the refractory metal film is a tungsten film.

7. The method as claimed in claim 1 wherein the nuclei of the refractory metal film are formed in a temperature range not lower than 450° C.

8. The method as claimed in claim 1 wherein said substrate has a titanium-based adherent layer on its surface.

9. The method as claimed in claim 4, wherein said nuclei of the refractory metal are formed by reducing $WF_6$ gas with $H_2$.

10. The method as claimed in claim 4, wherein said refractory metal film is formed by reducing $WF_6$ with $SiH_4$ under a rate determined by the rate of the surface reaction.

* * * * *